United States Patent [19]

Schiller

[11] Patent Number: 4,713,144

[45] Date of Patent: Dec. 15, 1987

[54] COMPOSITION AND METHOD FOR STRIPPING FILMS FROM PRINTED CIRCUIT BOARDS

[75] Inventor: Harold Schiller, Long Beach, Calif.

[73] Assignee: Ardrox Inc., La Mirada, Calif.

[21] Appl. No.: 893,027

[22] Filed: Aug. 1, 1986

[51] Int. Cl.[4] .................. C23F 1/02; B44C 1/22; C03C 15/00; C03C 25/06

[52] U.S. Cl. ................... 156/656; 134/3; 134/41; 156/640; 156/664; 156/666; 156/902; 252/79.2; 252/79.4

[58] Field of Search ............... 134/3, 34, 41; 252/79.2, 79.4, 142; 156/640, 656, 664, 666, 901, 902

[56] References Cited

U.S. PATENT DOCUMENTS

| | | | |
|---|---|---|---|
| 2,318,559 | 5/1943 | Percival | 148/8 |
| 2,872,302 | 2/1959 | Bulan | 252/79.2 |
| 3,015,630 | 1/1962 | Thompson et al. | 252/101 |
| 3,253,968 | 5/1966 | Sheperd et al. | 156/642 |
| 3,349,036 | 10/1967 | Campbell | 252/101 |
| 3,367,874 | 2/1968 | Haviland et al. | 252/79.2 |
| 3,888,778 | 6/1975 | Beckwith et al. | 252/79.4 X |
| 4,212,701 | 7/1980 | Russel et al. | 156/665 |
| 4,274,908 | 6/1981 | Fishter et al. | 156/637 |
| 4,424,097 | 1/1984 | Lipka et al. | 156/656 |
| 4,425,185 | 1/1984 | Fishter et al. | 156/656 |
| 4,554,049 | 11/1985 | Bastenbeck | 252/79.4 X |

Primary Examiner—William A. Powell
Attorney, Agent, or Firm—Harris, Kern, Wallen & Tinsley

[57] ABSTRACT

A composition and method for stripping solder and the underlying tin-copper alloy from the copper substrate of a printed circuit board with a single application of the composition. An aqueous solution of nitric acid, ferric nitrate and sulfamic acid, which may be sprayed directly onto the printed circuit board for removing both the solder and the alloy.

11 Claims, No Drawings

COMPOSITION AND METHOD FOR STRIPPING FILMS FROM PRINTED CIRCUIT BOARDS

BACKGROUND OF THE INVENTION

This invention relates to the removal of solder films from printed circuit boards and in particular, to a new and improved method and composition for stripping the solder film and the underlying tin-copper alloy from the copper substrate of a printed circuit board in a single application of the composition, preferably by spraying.

A typical printed circuit board has a copper conductor pattern on an insulating support. Solder is applied onto the copper substrate, typically by electroplating. The solder film typically is in the order of 0.0003 inches thick which is the standard thickness used in most present day processes. This is a nominal value, for the thickness may vary considerably over the board and from board to board. After the solder film is applied onto the copper, a thin film of copper-tin alloy forms between the copper and the solder, typically about 0.000002 to 0.000004 inches thick. This copper-tin alloy film increases in thickness with time.

As used in the specification and claims, the word "solder" includes the various tin-lead alloys and substantially pure tin as used in providing films on printed circuit boards. Such films are produced by various methods, including electroplating, chemical deposition and immersion in a melt. While the 60-40 tin-lead solder film typically is about 0.0003 to 0.0004 inches thick, the pure tin film typically is about 0.0002 inches thick. The film is used as a resist over the copper during etching of the copper in the production of solder mask over bare copper boards.

In the manufacturing process the solder film is stripped from the copper substrate. Two types of compositions have been used for this solder stripping in the past. One composition is an acid solution of hydrogen peroxide and a fluoride. The other stripper is a nitric acid solution inhibited so that it will not attack copper. In general, the nitric acid based solder strippers are superior to the peroxide-fluoride based strippers, and have been used commercially for a number of years.

The peroxide-fluoride compositions are undesirable because there is an exothermic reaction during the stripping which heats the solution to a temperature which decomposes the unstable peroxide and makes the solution unusable. Hence the solution requires cooling during use. Also, the peroxide-fluoride solutions are slower in operation than the nitric acid solutions and have a toxicity problem.

In the conventional nitric acid stripper system, the nitric acid solution is maintained in a tank and the board is immersed in the solution for a period of time required to dissolve the solder. Following removal of the solder, it is necessary to remove the tin-copper alloy layer to expose the copper substrate. This is achieved by then immersing the board in a second tank containing another solution which dissolves the tin-copper alloy and ordinarily a small amount of the pure copper substrate. This second solution may be for example, ferric chloride, ammonium persulfate, peroxide sulfuric acid, or peroxide-flouride.

Hence it is seen that the conventional system of removing solder and the underlying alloy from a printed circuit board requires two baths with different compositions of solutions, and two application steps in the stripping process.

It is an object of the present invention to provide a new and improved stripping composition and method of stripping utilizing only a single composition and a single application step. A further object is to provide such a composition and method which can be used at room temperature, which can be applied to the circuit board by spraying as well as by dipping, and which can accomplish the stripping operation in a relatively short time, typically one minute or less.

These and other objects, advantages, features and results will more fully appear in the course of the following description.

SUMMARY OF THE INVENTION

A metal-dissolving liquid for stripping solder and the underlying tin-copper alloy from the copper substrate of a printed circuit board, comprising an aqueous solution of nitric acid in an amount sufficient to dissolve the solder, sulfamic acid in an amount sufficient to react with and eliminate nitrous acid initially present and/or formed during the stripping operation, and ferric nitrate in an amount sufficient to dissolve tin-copper alloy.

More specifically a liquid consisting essentially of an aqueous solution of 5 to 50 volume percent of 69% nitric acid aqueous solution, 1 to 50 volume percent of 45% ferric nitrate aqueous solution, 5 grams per liter to saturation of sulfamic acid, and the balance water.

A method comprising providing such an aqueous solution and applying the solution to the printed circuit board, preferably by spraying directly onto the board.

DESCRIPTION OF THE PREFERRED EMBODIMENTS

The composition of the invention is an aqueous solution with nitric acid, sulfamic acid and ferric nitrate as essential ingredients.

It is known that nitric acid will dissolve solder, and that sulfamic acid will inhibit the attack of nitric acid on copper. Also it is known that ferric nitrate will dissolve copper and tin-copper alloys. However, it has not been known to utilize the three constituents in a single solution in a single application for successive removal of solder, tin-copper alloy, and copper. The composition of the invention in the ranges set forth produces the desired reactions in the desired sequence to achieve the stripping result in an economical time and operating at room temperature without requiring temperature control.

The metal-dissolving liquid consists essentially of an aqueous solution of nitric acid in an amount sufficient to dissolve the solder, sulfamic acid in an amount sufficient to react with and eliminate nitrous acid initially present and/or formed during the stripping operation, and ferric nitrate in an amount sufficient to dissolve tin-copper alloy.

The removal of solder, which constitutes the principal amount of material removed, is accomplished by a reaction between the nitric acid and the metals lead and tin of the solder. During this reaction, the sulfamic acid serves as an inhibitor to prevent the nitric acid from attacking the intermetallic tin-copper alloy or the underlying copper. The ferric nitrate is not exhausted during the dissolution of the relatively thick solder layer. However, the ferric nitrate does react with the tin-copper film and then with the underlying copper substrate. The amount of the pure copper removed is controlled by controlling the time during which the board is exposed to the solution. Typically the time is in the order of 30 seconds to one minute. While the sulfamic acid inhibits the activity of the nitric acid, it does not inhibit the ferric nitrate. It has been found that these three ingredients can be maintained successfully in a single aqueous solution and will achieve the successive stripping operations.

The concentration of sulfamic acid in the solution is not critical provided there is enough present to react with and eliminate any nitrous acid that may be present in the original nitric acid of the composition or that may be generated by chemical reactions taking place during the solder stripping and copper etching processes. The lower limit of sulfamic acid concentration for a non-replenishable system that is commerically practicable may be placed at about 5 grams per liter (gm/L). The upper limit can approach the solubility of sulfamic acid in the stripping solution.

During the stripping operation, the nitric acid is consumed, and there is a buildup of lead nitrate and tin compound in the stripping solution.

In a typical commercial installation, the boards to be stripped are transported by conveyor through a spray booth having one or more spary heads. The stripping solution is continuously recirculated from the sump of the booth to the spray heads. The speed of the conveyor is varied to obtain the desired removal of the material from the board. In time the efficiency of the stripping solution is reduced, the time required for removal of the solder film increases, and the conveyor speed is reduced. When the time required for removal becomes too long for economical operation, the stripping solution in the booth is replaced by a fresh quantity of stripping solution. This replacement may occur weekly or daily or at shorter intervals, depending upon the size of the booth, the amount of material to be removed and the production rate.

It would be possible, but perhaps inconvenient in plant practice, to start a batch of solder stripper with a sulfamic acid concentration lower than about 5 gm/L and to make additions of sulfamic acid as needed to suppress the formation of appreciable quantities of nitrous acid. For practical solder stripping solutions, concentrations of sulfamic acid from 5 gm/L to 70 gm/L are adequate.

The concentration of nitric acid, for practical purposes, is limited on the high side by possible damage to printed circuit board substrates and to the equipment in which the solder stripping solutions are used. It has been found that there is no practical need to exceed concentrations of nitric acid higher than about 50 volume percent of 69% nitric acid. Concentrations considerably less than 40 volume percent yield useful solder stripping solutions.

The concentration of nitric acid is limited on the low side by the time that may be allotted for the solder stripping operation and by the total amount of solder a given volume of solder stripping solution may be expected to strip before it becomes spent. If neither of these considerations is of importance, the nitric acid content can be as low as 5 volume percent of 69% nitric acid or less and still effectively strip solder from copper.

However, the concentration of nitric acid is an important factor in determining the rate at which the solder is stripped. If the economic factors dictate that, for example, approximately 0.0003 inches thick electroplated solder is to be consistently stripped in less than one minute at 80° F., the concentration of nitric acid should be at least about 10 volume percent of 69% nitric acid provided that the ferric nitrate concentration is about 5 volume percent of 45% ferric nitrate. The porosity of metal to be removed, the thickness of the metal and its position on the board and the age of the board also are factors which affect the time required to clean the board.

With nitric acid in the range of about 15 to 20 volume percent of 69% nitric acid and at room temperature or slightly above, a concentration of 45% ferric nitrate of 17 volume percent will yield a solution that can strip a typical 0.0003 inches thick film of electroplated solder and remove the intermetallic tin-copper alloy layer in about one half minute. Lower concentrations of ferric nitrate result in more time required to strip the solder and remove the intermetallic layer, and higher concentrations can reduce the time to as little as 15 to 20 seconds.

The compositions contemplated in this patent application are aqueous solutions of ferric nitrate, nitric acid and sulfamic acid.

Ferric nitrate is obtainable commerically as crystals of $Fe(NO_3)_3.9H_2O$ and as an aqueous solution containing 45% by weight of anhydrous $Fe(NO_3)_3$. The concentration of ferric nitrate in the subject compositions may be expressed as grams per liter of $Fe(NO_3)_3.9H_2O$, weight percent of $Fe(NO_3)_3$ $9H_2O$, grams per liter of anhydrous $Fe(NO_3)_3$, weight percent anhydrous $Fe(NO_3)_3$ or as a volume percent of the 45% $Fe(NO_3)_3$ aqueous solution. For simplicity we prefer the last.

Nitric acid is commerically available as a 69% by weight aqueous solution of $HNO_3$. Again, for ease of preparation, the nitric acid content will be expressed as percent by volume percent of a 69% nitric acid solution.

Sulfamic acid is sold commercially as an anhydrous powder. Since the sulfamic acid acts as an inhibitor rather than as an active dissolving agent for tin and solder its weight or volume can be lumped with that of the diluent water in the figures set out in Table 1.

In the examples, Table 1 and the claims, the amount of nitric acid is expressed in terms of 69% nitric acid and the amount of ferric acid is expressed in terms of 45% ferric nitrate. These particular combinations have been used because these materials are commonly sold and used in such concentrations. However, it will be recognized by those skilled in the art that other concentrations, including the anhydrous state, can be used if desired, and that the figures stated for the compositions can readily be converted to other figures for other concentrations.

The preferred ranges for the three functional components of the stripper are about:

Nitric Acid—5 to 50 volume percent of 69% nitric acid aqueous solution,

Ferric Nitrate—1 to 50 volume percent of 45% ferric nitrate aqueous solution, and Sulfamic Acid—5 gm/L to saturation, with the balance water.

The more preferred ranges are about:

Nitric Acid—10 to 35 volume percent of 69% nitric acid aqueous solution,

Ferric Nitrate—5 to 25 volume percent of 45% ferric nitrate aqueous solution, and Sulfamic Acid—5 to 70 gm/L.

The presently preferred specific composition range is:

Nitric Acid—15 to 30 volume percent of 69% nitric acid aqueous solution,
Ferric Nitrate—15 to 20 volume percent of 45% ferric nitrate aqueous solution, and
Sulfamic Acid—50 gm/L.

Specific examples of compositions and their operation are set out in Table 1. Each example is an aqueous solution of the three ingredients, with the balance water. The composition was applied in each instance by continuously spraying onto the printed circuit board as the board. In an alternative method the board could be dipped into a bath of the composition. Cleaning by dipping usually takes more time for the same board and solution.

TEST PROCEDURE

Tests were conducted by spray-etching samples of solder plated and tin-plated printed circuit boards while varying the concentrations of 45% ferric nitrate solution and 69% nitric acid solution over a wide range. It was not considered necessary to vary the concentration of sulfamic acid since its function remains constant over a wide range of concentration.

The samples of solder-plated copper were obtained from a local printed circuit shop. The thickness of the solder plate was nominally 0.00025 inches and the composition of the solder nominally 60% tin—40% lead. After being solder plated the samples had been subjected to plating-resist stripping, copper etching and solder conditioning. The samples were about four months old.

The samples of tin-plated copper were also obtained from a local manufacturer of printed circuits. The thickness of the tin was nominally 0.0002 inches. The tin-plated samples had received no processing after tin plating except rinsing and drying. These samples were about two weeks old.

Test coupons about 3 inches × 4 inches were exposed to the solder stripping solutions in a Dynamil VRP 50 etching machine manufactured by Western Technology Inc. All tests were conducted at ambient temperature. Stripping times were observed visually. Duplicate tests were visually run on the solder samples; one test was run on the tin samples for each composition tested.

EXAMPLES

No. 1
454 ml. of 45% ferric nitrate solution, 1173 ml of 69% nitric acid solution and 169 gms of sulfamic acid were dissolved in sufficient water to bring the total volume to 3633 ml. At 80° F. 0.00025 inches of solder was stripped from a copper substrate in 16 seconds; 0.0002 inches of tin was stripped in 6 seconds at 80° F. Removal of the electroplated film was complete. Acceptable performance.

No. 2
757 ml. of 45% ferric nitrate solution, 380 ml. of 69% nitric acid solution and 190 gms of sulfamic acid were dissolved in sufficient water to bring the total volume to 3410 ml. At 85° F. 0.00025 inches thickness of electroplated solder was stripped in 30 seconds. There were no solder residues left on the exposed copper surface. Acceptable performance.

No. 3
378 ml. of 45% ferric nitrate solution, 1892 ml. of 69% nitric acid solution and 190 gms. of sulfamic acid were dissolved in sufficient water to bring the total volume to 7570 ml. At 82° F. it required 33 second to strip the solder 0.00025 inches thick and it required 17 seconds to strip tin 0.0002 inches thick. Acceptable performance.

No. 4
1135 ml. of 45% ferric nitrate solution, 1135 ml. of 69% nitric acid solution and 190 gms. of sulfamic acid were dissolved in enough water to bring to total volume to 9462 ml. at 80° F. it required 67 second to strip a film of electroplated solder 0.00025 inches thick from copper. It required 45 seconds at 80° F. to strip a 0.0002 inch thick film of electroplated tin from copper. Barely acceptable performance.

No. 5
946 ml. of 69% nitric acid and 190 gm. of sulfamic acid were dissolved in enough water to bring the total volume to 3028 ml. After exposing a sample of copper electroplated with 0.00025 inch thick solder to a spray of this solution at 85° F. for three minutes the underlying copper was not exposed. Unacceptable performance as a one step stripper.

No. 6
38 ml. of 45% ferric nitrate solution, 380 ml. of 69% nitric acid solution and 190 gms. of sulfamic acid were dissolved in enough water to bring the total volume to 3066 ml. Electroplated solder 0.00025 inches thick was incompletely removed from copper at 78° F. after 3 minutes and 20 second of spraying. Unacceptable performance.

No. 7
380 ml. of 45% ferric nitrate solution, 946 ml. of 69% nitric acid solution and 190 gms. of sulfamic acid were dissolved in enough water to bring the total volume to 3408 ml. At 87° F. it required 10 seconds to strip 0.00025 inches thick solder plate and 25 seconds to strip 0.0008 inches thick solder plate from copper. Acceptable performance.

Data from the experiments were plotted on three-component graphs to determine the effective concentration ranges for ferric nitrate and nitric acid. Since the time required for stripping solder or tin is a key factor in determining the utility of a stripper, three time intervals were chosen as significant, (1) times of about 30 seconds or less, (2) times of about 30 seconds to one minute, and (3) times greater than about one minute. Solder stripper solutions that required 30 seconds or less would be acceptable commercially. Solutions requiring between 30 seconds and about one minute, although workable, would be less acceptable. Solutions requiring more than about one minute and especially those that resulted in patchy or incomplete removal of the solder or tin plate would not be acceptable. For the stripping of solder the least amount of nitric acid is about 5 volume percent. The upper limit to nitric acid content, set arbitrarily at 50 volume percent, is governed not by performance of the solder stripping solution but by the difficulties arising from acid fumes and attack on printed circuit substrates or on equipment used. For stripping solder the lower limit for ferric nitrate is about 1 volume percent; the upper limit for practical purposes, need not exceed 50 volume percent. A minimum of a few percent of sulfamic acid is needed so that there is some sulfamic acid present in the solution. The limits for stripping tin are about the same as those for stripping solder.

Table 1 sets out the results of a series of tests carried out to determine suitable limits for the stripping composition of the invention. Examples 1–7 above were taken from Table 1, except for the test of Example 7 on 0.0008 inch thick solder plate. In the table, the amounts of the components are converted to volume percent.

The composition of the present invention provides for removal of solder and for removal of tin-copper alloy from a printed circuit board with a single solution, which solution can be applied in a single step, as by spraying. The composition of the invention is stable both when in storage and when in use, accomplishes complete solder stripping and alloy stripping in relatively short and economic time, and may be utilized at room temperature without requiring any temperature control for the solution, such as heating or cooling. Further, the solution and its use substantially reduce the toxicity problems encountered with certain other stripping solutions.

TABLE 1

| 45% Ferric Nitrate Soln. ml. | 69% Nitric Acid Soln. ml. | 190 gm Sulfamic Acid + Water ml. | Total Volume ml. | Vol % Ferric Nitrate Soln. | Vol % Nitric Acid Soln. | Vol % Sulfamic Acid + Water | Removal Time of .00025" 60/40 solder min:sec | Removal Time of .0002" tin min:sec | Temp °F. | Remarks |
|---|---|---|---|---|---|---|---|---|---|---|
| Run #1 | | | | | | | | | | |
| 757 | 0 | 2273 | 3030 | 25.0 | 0 | 75.0 | 1:30–2:00 | | 83 | patchy residue |
| 757 | 38 | 2273 | 3068 | 24.7 | 1.3 | 74.0 | 1:15–1:30 | | 84 | patchy residue |
| 757 | 76 | 2273 | 3106 | 24.4 | 2.4 | 73.2 | 1–1:30 | | 84 | removal complete |
| 757 | 190 | 2273 | 3220 | 23.5 | 5.9 | 70.6 | 1 | | 85 | removal complete |
| 757 | 380 | 2273 | 3410 | 22.2 | 11.1 | 66.7 | 0:30 | | 85 | removal complete |
| 757 | 570 | 2273 | 3600 | 21.0 | 15.8 | 63.2 | 0:20 | | 86 | removal complete |
| Run #2 | | | | | | | | | | |
| 0 | 946 | 2082 | 3028 | 0 | 31.2 | 68.8 | does not remove intermetallic layer | | 85 | |
| 38 | 946 | 2082 | 3066 | 1.2 | 30.9 | 67.9 | 1:15 | | 85 | complete removal |
| 76 | 946 | 2082 | 3104 | 2.4 | 30.5 | 67.1 | 0:40 | | 86 | complete removal |
| 114 | 946 | 2082 | 3142 | 3.6 | 30.1 | 66.3 | 0:32 | | 86 | complete removal |
| 190 | 946 | 2082 | 3218 | 5.9 | 29.4 | 64.7 | 0:24 | | 87 | complete removal |
| 380 | 946 | 2082 | 3408 | 11.1 | 27.8 | 61.1 | 0:19 | | 87 | complete removal |
| 760 | 946 | 2082 | 3788 | 20.0 | 25.0 | 55.0 | 0:15 | | 88 | complete removal |
| Run #3 | | | | | | | | | | |
| 38 | 380 | 2648 | 3066 | 1.2 | 12.4 | 86.4 | 3:20 | | 78 | incomplete removal |
| 76 | 380 | 2648 | 3104 | 2.5 | 12.2 | 85.3 | 1:40 | | 78 | incomplete removal |
| 114 | 380 | 2648 | 3142 | 3.6 | 12.1 | 84.3 | 1:10 | | 78 | incomplete removal |
| 190 | 380 | 2648 | 3218 | 5.9 | 11.8 | 82.3 | 1:10 | | 78 | incomplete removal |
| Run #4 | | 169 gms Sulfamic Acid + water ml. | | | | | | | | |
| 757 | 1022 | 2006 | 3785 | 20.0 | 27.0 | 53.0 | 0:19 | 0:08 | 80 | removal complete |
| 757 | 1022 | 3899 | 5678 | 13.3 | 18.0 | 68.7 | 0:35 | 0:15 | 80 | removal complete |
| 757 | 1022 | 5791 | 7570 | 10.0 | 13.5 | 76.5 | 1:45 | 0:54 | 80 | removal complete |
| 757 | 1022 | 7684 | 9463 | 8.0 | 10.8 | 81.2 | 1:45 | 1:20 | 80 | removal incomplete |
| Run #5 | | | | | | | | | | |
| 454 | 1173 | 2006 | 3633 | 12.5 | 32.3 | 55.2 | 0:16 | 0:06 | 80 | complete removal |
| 454 | 1173 | 3899 | 5526 | 8.2 | 21.2 | 70.6 | 0:26 | 0:11 | 80 | complete removal |
| 454 | 1173 | 5791 | 7418 | 6.1 | 15.8 | 78.1 | 0:45 | 0:25 | 80 | complete removal |
| 454 | 1173 | 7684 | 9311 | 4.9 | 12.6 | 82.5 | 1:10 | 0:55 | 80 | complete removal |
| 454 | 1173 | 9576 | 11203 | 4.0 | 10.5 | 85.5 | 1:56 | 1:57 | 80 | incomplete removal |
| Run #6 | | | | | | | | | | |
| 908 | 587 | 2138 | 3633 | 25.0 | 16.2 | 58.8 | 0:30 | 0:17 | 78 | complete removal |
| 908 | 587 | 4031 | 5526 | 16.4 | 10.6 | 73.0 | 1:15 | 0:53 | 78 | removal incomplete of solder |
| 908 | 587 | 5923 | 7418 | 12.3 | 7.9 | 79.8 | 2:30 | 1:53 | 78 | removal incomplete of solder |
| Run #7 | | 190 gm Sulfamic Acid + Water ml. | | | | | | | | |
| 1135 | 1135 | 1515 | 3785 | 30.0 | 30.0 | 40.0 | 0:26 | 0:06 | 79 | complete removal |
| 1135 | 1135 | 2461 | 4731 | 24.0 | 24.0 | 52.0 | 0:17 | 0:06 | 79 | complete removal |
| 1135 | 1135 | 3407 | 5677 | 20.0 | 20.0 | 60.0 | 0:20 | 0:12 | 80 | complete removal |
| 1135 | 1135 | 4353 | 6623 | 17.1 | 17.1 | 65.8 | 0:29 | 0:14 | 80 | complete removal |
| 1135 | 1135 | 5300 | 7570 | 15.0 | 15.0 | 70.0 | 0:34 | 0:21 | 80 | complete removal |
| 1135 | 1135 | 6246 | 8516 | 13.3 | 13.3 | 73.4 | 0:40 | 0:35 | 80 | complete removal |
| 1135 | 1135 | 7192 | 9462 | 12.0 | 12.0 | 76.0 | 0:67 | 0:45 | 80 | complete removal |
| 1135 | 1135 | 8138 | 10408 | 10.9 | 10.9 | 78.2 | 1:10 | 0:54 | 80 | removal incomplete of solder |
| Run #8 | | | | | | | | | | |
| 1892 | 378 | 1515 | 3785 | 50.0 | 10.0 | 40.0 | 0:28 | 0:33 | 76 | complete removal |
| 1892 | 378 | 2461 | 4731 | 40.0 | 8.0 | 52.0 | 0:59 | 0:60 | 76 | complete removal |
| 1892 | 378 | 3407 | 5677 | 33.3 | 6.7 | 60.0 | 2:00+ | 1:18 | 76 | removal incomplete of solder |
| Run #9 | | | | | | | | | | |

TABLE 1-continued

| 45% Ferric Nitrate Soln. ml. | 69% Nitric Acid Soln. ml. | | Total Volume ml. | Vol % Ferric Nitrate Soln. | Vol % Nitric Acid Soln. | Vol % Sulfamic Acid + Water | Removal Time of .00025" 60/40 solder min:sec | Removal Time of .0002" tin min:sec | Temp °F. | Remarks |
|---|---|---|---|---|---|---|---|---|---|---|
| 378 | 1892 | 1515 | 3785 | 10.0 | 50.0 | 40.0 | 0:34 | 0:14 | 76 | complete removal |
| 378 | 1892 | 2461 | 4731 | 8.0 | 40.0 | 52.0 | 0:27 | 0:16 | 82 | complete removal |
| 378 | 1892 | 3407 | 5677 | 6.7 | 33.3 | 60.0 | 0:25 | 0:14 | 82 | complete removal |
| 378 | 1892 | 4353 | 6623 | 5.7 | 28.6 | 65.7 | 0:23 | 0:15 | 82 | complete removal |
| 378 | 1892 | 5300 | 7570 | 5.0 | 25.0 | 70.0 | 0:33 | 0:17 | 82 | complete removal |
| 378 | 1892 | 6246 | 8516 | 4.4 | 22.2 | 73.4 | 0:42 | 0:27 | 82 | complete removal |
| 378 | 1892 | 7192 | 9462 | 4.0 | 20.0 | 76.0 | 0:46 | 0:32 | 82 | complete removal |
| 378 | 1892 | 8138 | 10408 | 3.6 | 18.2 | 78.2 | 0:54 | 0:34 | 82 | complete removal |
| 378 | 1892 | 9085 | 11355 | 3.3 | 16.7 | 80.0 | 1:14 | 0:46 | 82 | complete removal |
| 378 | 1892 | 10031 | 12301 | 3.1 | 15.4 | 81.5 | 1:20 | 1:03 | 82 | complete removal |
| 378 | 1892 | 10977 | 13247 | 2.8 | 14.3 | 82.9 | 1:33 | 1:30 | 82 | complete removal |

I claim:

1. A metal dissolving liquid for stripping solder and the underlying tin-copper alloy from the copper substrate of a printed circuit board, consisting essentially of an aqueous solution of
    about 5 to 50 volume percent of 69% nitric acid aqueous solution,
    about 1 to 50 volume percent of 45% ferric nitrate aqueous solution,
    about 5 grams per liter to saturation of sulfamic acid, and
    the balance water.

2. A metal dissolving liquid for stripping solder and the underlying tin-copper alloy from the copper substrate of a printed circuit board, consisting essentially of an aqueous solution of
    about 1 to 35 volume percent of 69% nitric acid aqueous solution,
    about 5 to 25 volume percent of 45% ferricanitrate aqueous solution,
    about 5 to 70 grams per liter of sulfamic acid, and the balance water.

3. A metal dissolving liquid for stripping solder and the underlying tin-copper from the copper substrate of a printed circuit board, consisting essentially of an aqueous solution of nitric acid in an amount sufficient to dissolve solder, sulfamic acid in an amount sufficient to react with and eliminate nitrous acid initially present and/or formed during the stripping operation, and ferric nitrate in an amount sufficient to dissolve tin-copper alloy.

4. A metal dissolving liquid for stripping solder and the underlying tin-copper alloy from the copper substrate of a printed circuit board, consisting essentially of 15 to 30 volume percent of an aqueous solution of 69% nitric acid aqueous solution, 15 to 20 volume percent of an aqueous solution of 45% ferric nitrate aqueous solution, and sulfamic acid in an amount sufficient to react with and eliminate nitrous acid initially present and/or formed during the stripping operation.

5. In a method of rapidly stripping solder and the underlying tin-copper alloy from the copper substrate of a printed circuit board, the steps of:
    providing an aqueous solution consisting essentially of about 5 to 50 volume percent of 69% nitric acid aqueous solution, about 1 to 50 volume percent of 45% ferric nitrate aqueous solution, about 5 grams per liter to saturation of sulfamic acid, and the balance water; and
    applying the solution to the printed circuit board.

6. The method as defined in claim 5 including applying the solution by spraying directly onto the printed circuit board.

7. In a method of rapidly stripping solder and the underlying tin-copper alloy from the copper substrate of a printed circuit board, the steps of:
    providing an aqueous solution consisting essentially of about 10 to 35 volume percent of 69% nitric acid aqueous solution, about 5 to 25 volume percent of 45% ferric nitrate aqueous solution, about 5 to 70 grams per liter per sulfamic acid, and the balance water; and
    applying the solution to the printed circuit board.

8. The method as defined in claim 7 including applying the solution by spraying directly onto the printed circuit board.

9. In a method of rapidly stripping solder and the underlying tin-copper alloy from the copper substrate of a printed circuit board, the steps of:
    proving an aqueous solution consisting essentially of nitric acid in an amount sufficient to dissolve solder, sulfamic acid in an amount sufficient to react with and eliminate nitrous acid initially present and/or formed during the stripping operation, and ferric nitrate in an amount sufficient to dissolve tin-copper alloy; and
    applying the solution to the printed circuit board.

10. The method as defined in claim 9 including applying the solution by spraying directly onto the printed circuit board.

11. In a method of rapidly stripping solder and the underlying tin-copper alloy from the copper substrate of a printed circuit board, the steps of:
    providing an aqueous solution consisting essentially of 15 to 30 volume percent of 69% nitric acid aqueous solution, 15 to 20 volume percent of 45% ferric nitrate aqueous solution, and sulfamic acid in an amount sufficient to react with and eliminate nitrous acid initially present and/or formed during the stripping operation: and
    applying the solution to the printed circuit board.

* * * * *